(12) United States Patent
Fukuda

(10) Patent No.: US 6,313,002 B1
(45) Date of Patent: Nov. 6, 2001

(54) ION-IMPLANTATION METHOD APPLICABLE TO MANUFACTURE OF A TFT FOR USE IN A LIQUID CRYSTAL DISPLAY APPARATUS

(75) Inventor: Kaichi Fukuda, Fukaya (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/160,187

(22) Filed: Sep. 25, 1998

(30) Foreign Application Priority Data

Sep. 25, 1997 (JP) .................................................. 9-260675

(51) Int. Cl.[7] .................................................. H01L 21/331
(52) U.S. Cl. .......................... 438/373; 438/372; 438/248; 438/546; 438/303
(58) Field of Search .................................... 438/248, 371, 438/369, 373, 376, 347, 350, 372, 549, 546, 303

(56) References Cited

U.S. PATENT DOCUMENTS

| 5,061,643 | * | 10/1991 | Yagi ...................................... 437/19 |
| 5,563,095 | * | 10/1996 | Frey ...................................... 437/141 |
| 5,753,531 | * | 5/1998 | Frey ........................................ 438/61 |
| 5,837,568 | * | 11/1998 | Yoneda et al. ........................ 438/147 |
| 5,926,239 | * | 7/1999 | Kumar et al. .......................... 349/69 |
| 5,935,373 | * | 8/1999 | Koshimizu ............................ 156/345 |

* cited by examiner

*Primary Examiner*—Matthew Smith
*Assistant Examiner*—Renzo Rocchegiani
(74) *Attorney, Agent, or Firm*—Pillsbury Winthrop LLP

(57) ABSTRACT

The present invention relates to a method of manufacturing a thin film transistor for use in a liquid crystal display apparatus or the like. In the method, impurity ions are implanted into a semiconductor by intermittently generating a plasma which generates impurity ions, for a predetermined period at a predetermined interval. By changing the duty rate at which the plasma is generated, the effective value of a beam current can be controlled over a wide range with excellent accuracy without changing rates of ions. As a result, it is possible to form a channel portion and a lightly doped drain layer of a field effect transistor which contains silicon as a main component, so that a field effect transistor and a liquid crystal display device can be manufactured with high quality and excellent productivity.

13 Claims, 2 Drawing Sheets

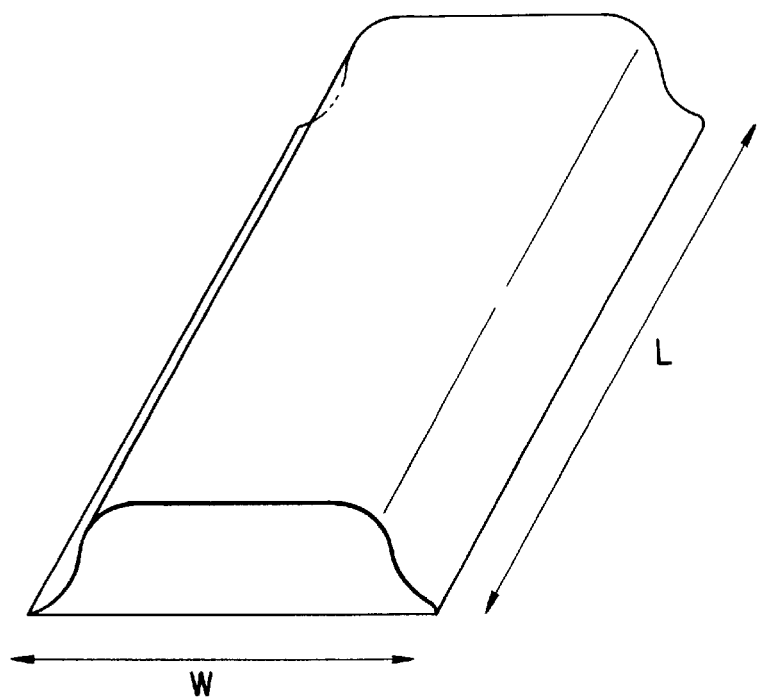
F I G. 2
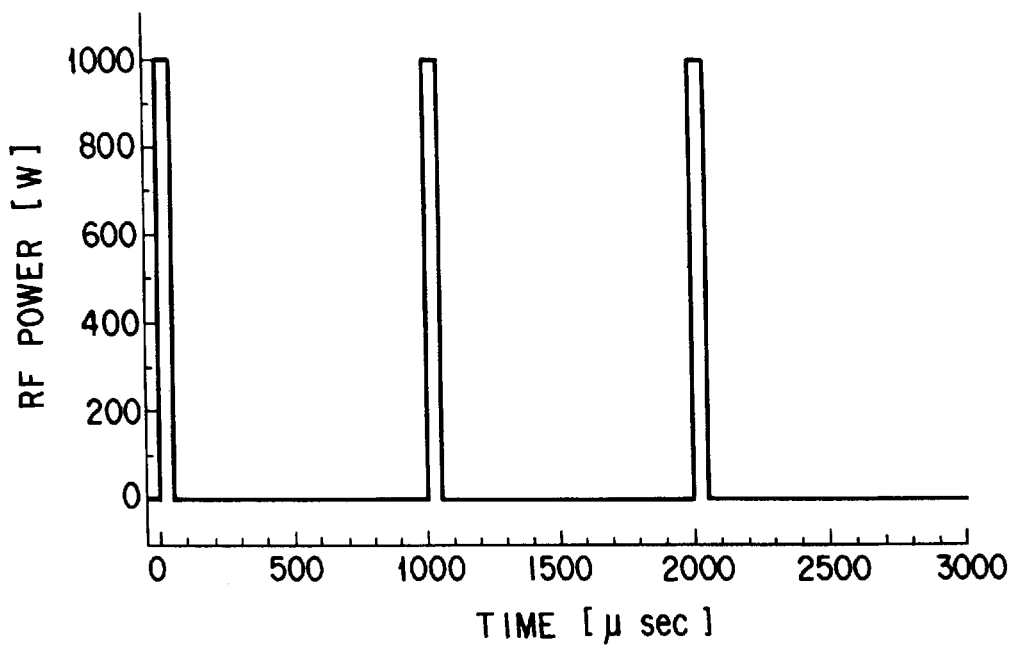
F I G. 3

ION-IMPLANTATION METHOD APPLICABLE TO MANUFACTURE OF A TFT FOR USE IN A LIQUID CRYSTAL DISPLAY APPARATUS

BACKGROUND OF THE INVENTION

The present invention relates to ion-implantation utilized for manufacturing a thin film transistor (TFT) of a liquid crystal display apparatus and an ion-implantation method.

To respond to a request that a drive circuit should be integrally formed on an array substrate in a step of manufacturing a liquid crystal display apparatus, studies and developments have been made to a poly-silicon thin film transistor (p-SiTFT) which is a thin film transistor (TFT) using a poly-silicon-based semiconductor layer.

Generally, in a poly-silicon thin film transistor, a low-resistance semiconductor layer used for source regions or drain regions is formed by ion-implantation at a high density. In a N-channel transistor, it is advantageous to adopt a lightly doped drain (LDD) structure in order to relax concentration of an electric field to the vicinity of a drain. A method of controlling the density of ions to be implanted has been widely used. In addition, to control the threshold voltage of the transistor, impurities of a much lower density than the LDD is doped into the channel region. In this case, an ion-implantation method is used.

In ion-implantation as described above, the amounts of ions to be implanted are as follows. With respect to a low-resistance layer for source and drain regions, phosphorus (P) or boron (B) is about $1\times10^{14}$ to $1\times10^{16}$ [cm$^{-2}$]. With respect to LDD regions, P is about $5\times10^{12}$ to $5\times10^{13}$ [cm$^{-2}$]. With respect to doping to channel regions, P or B is about $1\times10^{11}$ to $3\times10^{12}$ [cm$^{-2}$].

Thus, even the dose amount of ion-implantation varies over a range of four to five digits depending on the portions where ion-implantation is performed. In many cases, ion-implantation apparatuses having different specifications specialized for a large current and a small current are used for manufacturing a mono-silicon transistor, for example.

However, there is a problem that the manufacturing efficiency cannot be improved if apparatuses specialized for respective steps are prepared, in response to a demand that a device such as a liquid crystal display apparatus or the like should be manufactured in manufacturing steps less than those in a mono-silicon device, like a liquid crystal display apparatus. From the viewpoint of investment productivity, a plurality of steps need to be completed by one same apparatus, and the dose amounts ranging by about four to five digits should desirably be subjected to ion-implantation by one same apparatus, in ion-implantation.

Actually, in doping into source and drain regions at a high density, a beam current density of 10 [$\mu$A/cm$^2$] is required to reduce the processing time per sheet of substrate to about 30 seconds. Meanwhile, to achieve doping at a low density which is applicable to channel regions, the current value of an ion beam must be reduced and the doping time must further be shortened. However, the lower limit of a controllable time as an effective doping time is about 0.2 second depending on the method of scanning the substrate. In order to control $1\times10^{11}$ [cm$^{-2}$], the current density of an ion beam must be controlled to be 80 [nA/cm$^2$] or lower. Further, in case of a method in which the entire surface of a substrate is doped at once, the lower limit of a controllable time as a doping time is about 10 seconds and the current density of an ion beam must be controlled to be 1.6 [nA/cm$^2$] or lower.

Normally, discharging power is changed in order to change the current density of an ion beam, for example, in case where high frequency discharging is utilized. The change of current which can be controlled by only changing the discharging power is about three digits. Further, the rate of ions generated in a plasma changes depending on the kind of impurities if the discharging power is changed. Particularly, in an ion doping apparatus having no mass separation function for manufacturing a liquid crystal display apparatus, changes of rates of ions of different impurities becomes a problem.

For example, various kinds of ions such as $P^+$, $PH_x^+$, $P_2^+$, $P_2H_x^+$, $P^{++}$, $PH_x^{++}$, $H^+$, $H_2^+$, and $H_3^+$ are generated by high frequency discharging using a mixed gas of $PH_3$ and $H_2$. However, if the discharging power is increased, the rates of $H^+$, $H_2^+$, and $H_3^+$ tend to be increased and the rate of dopant ions tends to decrease. On the contrary, if the discharging power is decreased, the rates of $H^+$, $H_2^+$, and $H_3^+$ decrease and ion generation sources such as $P_2^+$ and $P_2H_x^+$ increase rather than $P^+$ and $PH_x^+$. That is, if the discharging power is decreased to perform doping at a low density, there is a problem that implantation depth of P is small.

A method of diluting a gas may be considered as a method for decreasing the beam current of dopant ions. For example, if $PH_3$ is diluted to 1% or 0.1% with use of $H_2$, the rate of ion generation sources relating to P in a plasma can be reduced to 10% or lower, and thus, it is possible to respond to doping at a low density to some extent. However, this method has a problem that the rate of the ion generation sources changes in accordance with elapsed time or due to soil on chamber walls or the rate of undesired impurities such as carbon (C) and oxygen (O) mixed therein increases. Further, the change of the rate of ion generation sources directly influences the threshold voltage in channel doping, and in case of a LDD, the change of the density influences a characteristic of the transistor is turned on and the drain proof against voltage of a transistor, resulting in a serious problem. Also, C and O mixed deteriorate the performance of the transistor.

Another method will be a method of changing the aperture of an electrode portion from which ions are extracted. For example, this is a method of providing an electrode having a large aperture and a detachable movable electrode having a small aperture and of controlling the ion beam current by putting the movable electrode like a shutter. Where the aperture is set to 1/100, the current value is expected to be reduced by about two digits. However, in this method, if the aperture is changed, the pressure in the plasma chamber changes so that the plasma condition is changed, thereby changing the rate of ion generation sources. It is therefore impossible to lower only the ion beam current. In addition, in many cases, the uniformity of the ion beam current is generally deteriorated if the aperture is decreased. This method is therefore not suitable for practical use.

As has been described above, it is difficult to control the dose amounts with high accuracy over a wide range and to manufacture a field effect transistor at low costs by using a conventional method of controlling an ion beam current in ion-implantation.

BRIEF SUMMARY OF THE INVENTION

The present invention has an object of providing an ion-implantation method capable of controlling the amount of ions to be implanted when implanting ions into a semiconductor layer so that the manufacturing efficiency can be improved when manufacturing a field effect transistor, for example.

According to the present invention, there is provided a method of manufacturing a semiconductor device including a semiconductor layer having a first region into which impurity ions are implanted at a first density and a second region into which impurity ions are implanted at a second density higher than the first density, comprising: a first step of generating a plasma intermittently at a first duty rate and of implanting impurity ions generated thereby into the first region; and a second step of generating a plasma intermittently at a second duty rate higher than the first duty rate or continuously, and of implanting impurity ions generated thereby into the second region.

Also, according to the present invention, a plurality of kinds of impurity ions can be simultaneously used without performing mass separation.

Further, according to the ion-implantation method of the present invention, the effective value of a beam current can be controlled over a wide range with high accuracy without changing the rates of ions generated.

Also, according to the ion-implantation method of the present invention, it is possible to achieve ion doping capable of controlling the threshold voltage of channel portions of a field effect transistor of a thin film type containing silicon as a main component.

Further, according to the ion-implantation method of the present invention, it is possible to form a lightly doped drain layer suitable for sources and drains of a field effect transistor of a thin film type containing silicon as a main component.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a schematic showing an energy distribution of an ion be supplied by the ion-implantation apparatus shown in FIG. 1; and FIG. 3 is a timing chart showing an example of a method of controlling a plasma generation apparatus in the ion-implantation apparatus shown in FIG. 1.

DETAILED DESCRIPTION OF THE INVENTION

Figure 1:
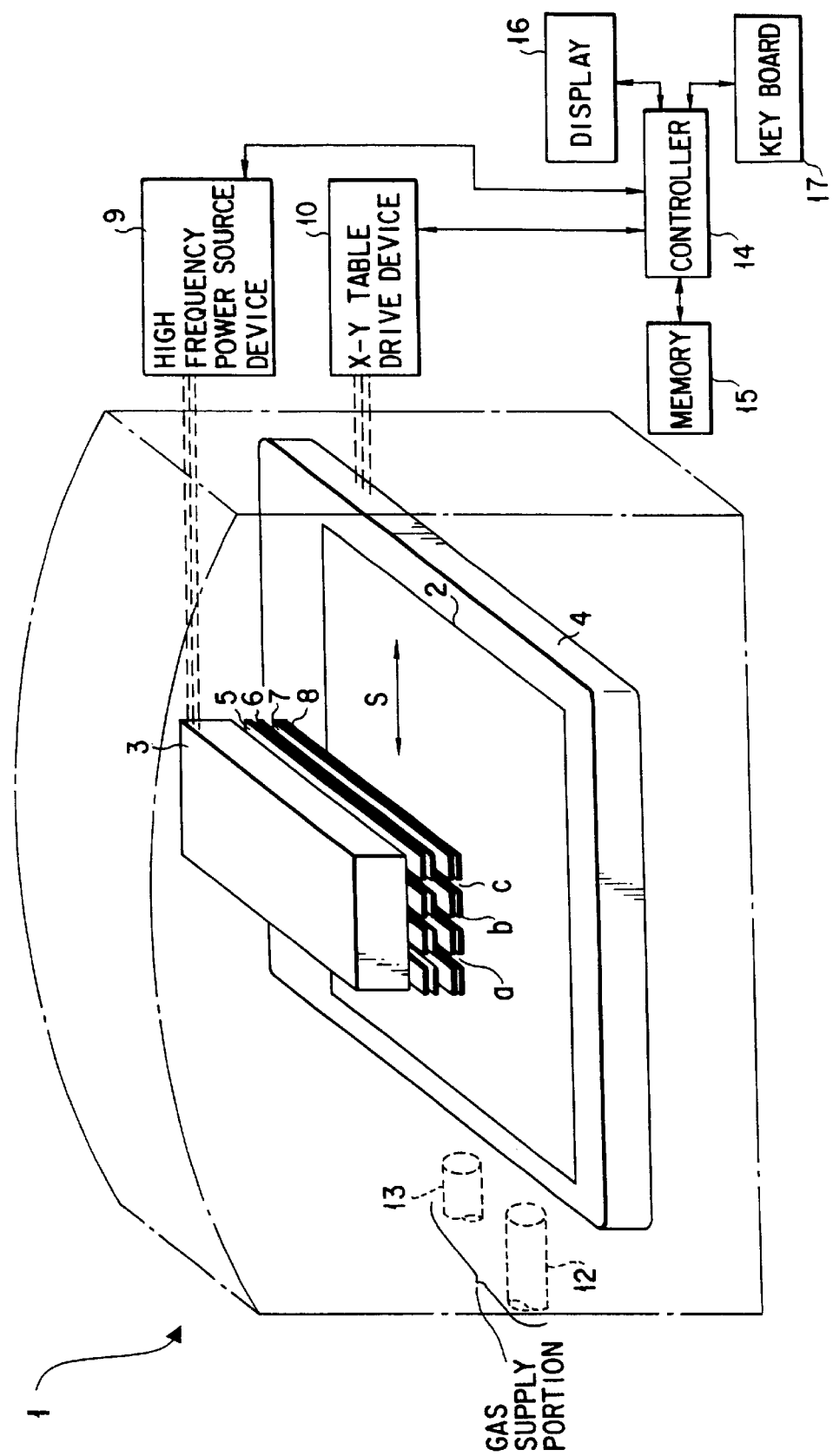
FIG. 1 is a schematic view showing an ion-implantation apparatus adopting an ion-implantation method according to the present invention.

In the following, a method of manufacturing a field effect transistor according to the present invention will be explained with reference to the drawings.

As shown in FIG. 1, an ion-implantation apparatus 1 is provided so as to oppose to a glass substrate 2 used for a liquid crystal display apparatus or the like and has a plasma generation device as an ion source, which is a plasma chamber 3. The glass substrate 2 is supported on a X-Y table 4 formed to be movable in two axial directions. In this manner, the glass substrate 2 is movable in the direction indicated by an arrow S and a direction perpendicular to the direction S.

A first electrode 5, second electrode 6, suppressor electrode 7, and ground electrode 8 are layered at predetermined intervals between the plasma chamber 3 and the glass substrate 2. Three slits a, b, and c are formed in the electrodes 5, 6, and 7.

The plasma chamber 3 as an ion source is connected with a high frequency discharging device 9 of an inductive coupling type and is supplied with a high frequency pulse of a predetermined frequency at a predetermined duty rate.

Therefore, an ion beam which has passed through the slits a, b, and c is irradiated onto the glass substrate 2. The X-Y table 4 is moved in the direction perpendicular to the longitudinal direction of the slits (or the direction of the arrow S) at a predetermined speed specifically described later by a two-axis motor controller (or X-Y table drive device) 10. In addition, the X-Y table 4 and the plasma chamber 3 are closed tightly by an airtight chamber 11 such that an appropriate buffer gas can be supplied through gas supply portions 12 and 13.

The ion-implantation apparatus 1 is of a non-mass-separation type in which a plurality of kinds of impurities are simultaneously implanted without (requiring) mass separation concerning the kinds of impurities when impurity ions subjected to field acceleration are implanted to a semiconductor substrate or a semiconductor thin film. An appropriate current density of an ion beam can be provided by a controller 14 for controlling the condition of the ion beam irradiated onto the glass substrate 2 from the plasma chamber 3. A memory 15 storing various data, a display device 16 used for monitoring inputted data and the operating state of the implantation apparatus and an input device (keyboard) 17 for inputting numerical data to be controlled, are connected to the controller 14.

The size of the ion beam (which is a projection (or irradiation) area viewed from the direction from the plasma chamber 3 to the glass substrate 2) is set to have a length L of 60 [cm] and a width W of 15 [cm] or so, as shown in FIG. 2, in order that the ion beam can be irradiated onto a glass substrate 2 of 55 [cm] ×65 [cm] or so.

Several examples of ion-implantation will be cited below.

10 [sccm] of 100% $PH_3$ gas is introduced into the plasma chamber 3, and total 1000 [W] of high frequency power at 13.56 [MHz] is applied to an antenna coil (not shown) for generating a plasma such that that the first electrode 5, the second electrode 6, and the suppressor electrode 7 are respectively applied with potentials of 70 [kV], 67 [kV], and −6 [kV]. Then, an ion beam of approximately 36 [mA] can be extracted.

As long as the lengthwise direction of the beam, the beam intensity can be maintained to be substantially uniform as a result of technical efforts made for arrangement of a gas supply system and electrodes up to today. Hence, the following is obtained in case of 36 [mA] per unit length.

$$36 \,[mA]/60\,[cm] = 600\,[\mu A/cm]$$

Meanwhile, the beam intensity distribution in the direction in which the glass substrate 2 is moved, i.e., the beam intensity distribution in the direction of arrow S slightly falls at both end portions as shown in FIG. 2. However, the average value of the beam current density is as follows where the width of spreading of the beam is 15 cm.

$$600\,[\mu A/cm]/15\,[cm] = 40\,[\mu A/c^2]$$

Further, when the beam current density is 40 [$\mu A/cm^2$], the following is the ion-implantation time for which ions are implanted while the glass substrate 2 is moved from an end portion thereof to another end portion in the direction of arrow S, where the beam width of a linear beam is 15 cm and the scanning speed of the glass substrate 2 is 5 [cm/sec].

$$15 \text{ [cm]}/5 \text{ [cm/sec]}=3 \text{ [sec]}$$

The amount of ions implanted is as follows.

$$40 \text{ [}\mu\text{A/cm}^2\text{]}\times3 \text{ [sec]}=120 \text{ [}\mu\text{c/cm}^2\text{]}$$

As a result, the following is obtained.

$$120 \text{ [}\mu\text{C/cm}^2\text{]}/1.602\times10^{-19} \text{ [C]}=7.4\times10^{14} \text{ [cm}^{-2}\text{]}$$

Accordingly, $1.5\times10^{15}$ [cm] is obtained by reciprocating the glass substrate 2 along the direction of arrow S for one time, so that doping at a high density suitable for source and drain regions can be performed.

Further, in the ion-implantation apparatus 1, it is possible to maintain the effective value of the ion current at a constant value during ion-implantation onto a semiconductor substrate or a semiconductor thin film by setting the duty rate of the high frequency pulse applied to the plasma chamber 3 from the high frequency discharging device 9. That is, when generating impurity ions in the plasma chamber 3, the effective value of the ion current during ion-implantation can be maintained at a constant value by setting the discharging frequency to 13.56 [MHz] in form of a pulse at a cycle of 1 [kHz].

FIG. 3 is a timing chart showing an example of plasma discharging.

In the example shown in FIG. 3, the high frequency output applied to the plasma chamber 3 is 1 [kW] and the duty rate thereof is 5%. Specifically, if the repetition frequency is 1 [kHz], the period for which the plasma is turned on during one cycle of 1 [msec] is 50 [$\mu$sec] and the period for which the plasma is turned off during one cycle is 950 [$\mu$sec].

Meanwhile, since the discharging frequency is 13.56 [MHz], the cycle is 73 [nsec]. Therefore, 678 times of discharging is included in the period of 50 [$\mu$sec] for which the plasma is turned on within one pulse. This means that a condition equivalent to continuous discharging can be provided even though the high frequency output supplied to the plasma chamber 3 is applied by pulse discharging.

By using pulse discharging as described above, a state in which an ion beam is outputted and a state in which no ion beams is outputted are repeated alternately. If the beam current density is, for example, 40 [$\mu$A/cm$^2$] when using normal high frequency discharging without using pulse discharging, the effective value of the beam current density is substantially 2 [$\mu$A/cm$^2$] where pulse discharging at a duty rate of 5% is used.

Likewise, where the repetition frequency is 1 [kHz] and the duty rate is 0.2%, one pulse is 2 [Msec] and the oscillation frequency during one pulse is 27. In this case, the effective value of the beam current density is 80 [nA/cm$^2$].

Meanwhile, the time for which ions are implanted into the glass substrate 2 is as follows where the effective value of the beam current density is 80 [nA/cm$^2$], the beam width of the ion beam is 15 [cm], and the glass substrate 2 is moved at a speed of 50 [cm/sec].

$$15 \text{ [cm]}/50 \text{ [cm/sec]}=0.3 \text{ [sec]}$$

Then, the amount of ions implanted is as follows.

$$80 \text{ [}\mu\text{A/cm}^2\text{]}\times0.3 \text{ [sec]}=24 \text{ [}\mu\text{c/cm}^2\text{]}$$

$$24 \text{ [}\mu\text{c/cm}^2\text{]}/1.602\times10^{-19} \text{ [C]}=1.5\times10^{11} \text{ [cm}^{-2}\text{]}$$

It is therefore possible to make control of the ion-implantation amount suitable for doping into channel regions.

Thus, even when the duty rate is set to 0.2%, a pulse having a repetition frequency of 1 [kHz] is applied 300 times during an ion-implantation period of 0.3 [sec]. This means that the ion beam is repeatedly irradiated at a pitch of 0.5 [mm], even in case where the glass substrate 2 is moved at a speed of 50 [cm/sec] in an ion beam having a beam width of 15 [cm]. Therefore, the uniformity of implanted ions within the substrate surface can be considered as being equivalent to that obtained by continuous discharging.

By thus optimally setting the duty rate and the speed at which the substrate is moved, appropriate control can be performed within a range from $1\times10^{11}$ [cm$^{-2}$] to $3\times10^{12}$ [cm$^{-2}$] which is an implantation amount required for doping into channel regions. For example, the duty rate is set to 0.2% and the moving speed of the glass substrate is set to 75 [cm/sec] in order to obtain $1\times10^{11}$ [cm$^{-2}$]. In order to obtain $3\times10^{12}$ [cm$^{-2}$], the duty rate is set to 2% and the moving speed of the glass substrate is set to 25 [cm/sec].

Since the discharging condition when pulse is applied is the same as that in continuous discharging, there is no risk that the rate of impurities in the plasma may change. It is therefore possible to reduce only the effective beam current value, unlike in a conventional beam current control method.

In particular, uniformity equal to that obtained by continuous discharging can be obtained as a result where the plasma which generates impurity ions is of alternating current plasma discharging at a frequency of 1 [MHz] to 10 [GHz] and where the period of the ON-state during one cycle in which an ON-state and an OFF-state of a plasma are repeatedly appear is set to be equal to or higher than twice the inverse number of the plasma discharging frequency.

Thus, according to the ion-implantation apparatus of the present embodiment, the effective value of the ion beam current can be controlled with high accuracy and the dose amount can be changed over a wide range, by generating the plasma which generates impurity ions such that an ON-state and an OFF-state of the plasma are repeated alternately thereby to change the duty rate as a rate of the time for which the plasma is in the ON-state, for example, relating to an ion-implantation apparatus by which impurity ions accelerated by field acceleration are implanted into a thin film transistor formed on the glass substrate 2 or into a semiconductor substrate or a semiconductor thin film typically used for manufacturing a liquid crystal display device.

Hence, doping into channel regions of a thin film transistor can be achieved with high accuracy, and a LDD and low resistance layers for source and drain regions can be formed also with high accuracy. It is accordingly possible to manufacture a field effect transistor and a liquid crystal display device with high quality and excellent productivity.

If the repetition frequency at which the ON-state and the OFF-state of the plasma are repeated alternately is set within a range of 100 [Hz] to 1 [MHz], the effective value of the ion current can be easily controlled with high accuracy. In addition, if the duty rate of the time for which the plasma is turned on is set to be equal to or greater than 0.001 and smaller than 1, the effective value of the ion current can be easily controlled with high accuracy.

Specifically, an ion-implantation apparatus capable of controlling the ion beam current with high accuracy during ion-implantation can be provided, for example, where the effective value of the ion current is within a range of 0.1 [nA/cm$^2$] to 100 [$\mu$A/cm$^2$]. Therefore, doping into channel regions of a thin film transistor can be achieved with high accuracy, and a LDD and low resistance layers for source and drain regions can be formed also with high accuracy, so that it is possible to manufacture a field effect transistor with high quality and excellent productivity.

For example, a field effect transistor with excellent quality at low costs can be manufacture in the following manner. A plasma is generated at a predetermined duty rate at channel portions of a field effect transistor containing silicon as a main component, and ions are implanted with the effective value of the ion current set within a range of 0.1 [$nA/cm^2$] or less. Phosphorus, arsenic (As) or boron or a compound thereof is injected, so that the threshold voltage of the field effect transistor can be controlled. Ions generated at a predetermined duty rate are implanted into source and drain regions. At least one of phosphorus, arsenic, and a compound thereof is implanted with the effective value of the ion current set within a range of 100 [$nA/cm^2$] to 100 [$\mu A/cm^2$], to form a lightly doped drain layer (LDD).

In the embodiment described above, a field effect transistor with excellent quality can also be manufactured in the following manner, in case where channel portions of a field effect transistor are formed by using non-single crystalline silicon on a substrate having insulating characteristic. A plasma is generated at a predetermined duty rate, and ions are implanted with the effective value of the ion current set within a range of 0.1 [$nA/cm^2$] to 1 [$\mu A/cm^2$]. Phosphorus, arsenic (As), or boron or a compound thereof is injected, and the threshold voltage of the field effect transistor is controlled. Ions generated at a predetermined duty rate are implanted into source and drain regions. At least one of phosphorus, arsenic, and a compound thereof is implanted with the effective value of the ion current set within a range of 10 [$nA/cm^2$] to 100 [$\mu A/cm^2$], to form a lightly doped drain layer (LDD).

As has been explained above, according to the present invention, a plasma which generates impurity ions is intermittently generated for a predetermined period at a predetermined interval to implant impurity ions into a semiconductor, and therefore, the effective value of the beam current can be controlled with high accuracy over a wide range, without changing the rates of kinds of ions. Accordingly, a channel portion and a lightly doped drain layer of a field effect transistor which contain silicon as a main component can be manufacture with excellent accuracy at low costs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device including a semiconductor layer having a first region into which impurity ions are implanted at a first density and a second region into which impurity ions are implanted at a second density higher than the first density, comprising:

a first step of generating a plasma intermittently at a first duty rate and implanting impurity ions generated thereby into the first region; and a second step of generating a plasma intermittently at a second duty rate higher then the first duty rate or continuously and implanting impurity ions generated thereby into the second region, wherein a first source gas is used in the first step and a second source gas is used in the second step, and the first source gas and the second source gas have substantially the same dilution value, and the concentration of the first source gas remains unchanged during the first step and the concentration of the second source gas remains unchanged during the second step.

2. A method according to claim 1, wherein a substantially equal discharging power is used to generate the plasma both in the first and second steps.

3. A method according to claim 1, wherein mass separation is not performed with respect to the kinds of ions but a plurality of kinds of ions are simultaneously implanted in the first and second steps.

4. A method according to claim 1, wherein the plasma is generated by a high frequency wave at an oscillation frequency ranging from 1 MHz to 10 GHz in the first step, and a period of an ON-state in one cycle in which the plasma is intermittently generated is twice longer than a cycle of the high frequency wave.

5. A method according to claim 1, wherein the first duty rate is equal to or higher than 0.001 and is lower than 1.

6. A method according to claim 1, wherein the second step is carried out after the first step, with the first region masked.

7. A method according to claim 1, wherein impurity ions are implanted into the first region by the plasma intermittently generated at the first duty rate with use of an ion current of 0.1 $nA/cm^2$ to 1 $\mu A/cm^2$, and impurity ions are implanted into the second region by the plasma generated intermittently at the second duty rate or generated continuously with use of an ion current of 10 $nA/cm^2$ to 100 $\mu A/cm^2$.

8. A method according to claim 1, wherein the semiconductor layer is made of poly-silicon.

9. A method according to claim 1, wherein the impurity ions contains at least one of phosphorus, arsenic, boron, and a compound thereof.

10. A method according to claim 1, wherein a ratio of the second density of the impurity ions implanted into the second region to a first amount of the impurity ions implanted into the first region is 1.6 to $5 \times 10^2$.

11. A method according to claim 1, wherein the semiconductor layer has a third region into which impurity ions are implanted at a third density higher than the second density, and the second step includes a step of generating a plasma intermittently at the second duty rate and of implanting impurity ions generated thereby into the second region, and a step of generating a plasma intermittently at the third duty rate or continuously and of implanting impurity ions generated thereby into the third region.

12. A method according to claim 11, wherein a ratio of the third density of the impurity ions implanted into the third region to a second amount of the impurity ions implanted into the second region is 2.0 to $2 \times 10^3$.

13. A method according to claim 11, wherein a ratio of the third density of the impurity ions implanted into the third region to the first density of the impurity ions implanted into the first region is $3.3 \times 10$ to $1 \times 10^5$.

* * * * *